US012696539B2

(12) United States Patent
Xu et al.

(10) Patent No.: US 12,696,539 B2
(45) Date of Patent: Jul. 28, 2026

(54) DISPLAY SUBSTRATE AND DISPLAY DEVICE

(71) Applicants: MIANYANG BOE OPTOELECTRONICS TECHNOLOGY CO., Ltd., Mianyang (CN); BOE TECHNOLOGY GROUP CO., LTD., Beijing (CN)

(72) Inventors: Haifeng Xu, Beijing (CN); Zifeng Wang, Beijing (CN); Wentao Wang, Beijing (CN); Lina Wang, Beijing (CN); Pei Wang, Beijing (CN); Yaoda Hou, Beijing (CN); Qing Tang, Beijing (CN); Yuantao Liu, Beijing (CN); Xin Cao, Beijing (CN); Yanchun Xie, Beijing (CN)

(73) Assignees: MIANYANG BOE OPTOELECTRONICS TECHNOLOGY CO., Ltd., Mianyang (CN); BOE TECHNOLOGY GROUP CO., LTD., Beijing (CN)

( * ) Notice: Subject to any disclaimer, the term of this patent is extended or adjusted under 35 U.S.C. 154(b) by 382 days.

(21) Appl. No.: 18/290,765

(22) PCT Filed: Jul. 29, 2022

(86) PCT No.: PCT/CN2022/108922
§ 371 (c)(1),
(2) Date: Jan. 20, 2024

(87) PCT Pub. No.: WO2024/021011
PCT Pub. Date: Feb. 1, 2024

(65) Prior Publication Data
US 2025/0113609 A1     Apr. 3, 2025

(51) Int. Cl.
*H10D 86/40* (2025.01)
*H10K 59/121* (2023.01)
(Continued)

(52) U.S. Cl.
CPC ....... *H10D 86/441* (2025.01); *H10K 59/1216* (2023.02); *H10K 59/131* (2023.02);
(Continued)

(58) Field of Classification Search
CPC .............. H10D 86/441; H10D 86/481; H10K 59/1216; H10K 59/131; H10K 59/88
See application file for complete search history.

(56) References Cited

U.S. PATENT DOCUMENTS

2020/0194461 A1 * 6/2020 Park ..................... H10D 86/411

* cited by examiner

*Primary Examiner* — Daniel P Shook
(74) *Attorney, Agent, or Firm* — HOUTTEMAN LAW LLC

(57) ABSTRACT

The present disclosure provides a display substrate and a display device. The display substrate has a display area, an edge area arranged on at least one side of the display area, and a transition area arranged between the display area and the edge area, the display substrate includes: a base substrate, a plurality of sub-pixels and a redundant line located on the base substrate, the plurality of sub-pixel being arranged in an array in the display area, the redundant line extending along a column direction of the sub-pixels and passing through the transition area; each sub-pixel includes: a pixel driving circuit; the pixel driving circuit includes a storage capacitor; at least a part of second electrodes of storage capacitors extend from the display area to the transition area and are electrically connected with the redundant line.

20 Claims, 2 Drawing Sheets

(51) Int. Cl.
*H10K 59/131* (2023.01)
*H10K 59/88* (2023.01)
*G09G 3/3233* (2016.01)

(52) U.S. Cl.
CPC ........... *H10K 59/88* (2023.02); *G09G 3/3233*
(2013.01); *G09G 2300/0819* (2013.01); *G09G*
*2300/0842* (2013.01); *G09G 2300/0861*
(2013.01); *H10D 86/481* (2025.01)

DISPLAY SUBSTRATE AND DISPLAY DEVICE

TECHNICAL FIELD

The disclosure relates to the field of display technology, and particularly relates to a display substrate and a display device.

BACKGROUND

With the continuous development of the display technology, users have higher and higher requirements on displayed pictures, and a full display camera (FDC) technology has emerged.

SUMMARY

The present disclosure is directed to at least one of problems in the prior art, and provides a display substrate and a display device.

In a first aspect, an embodiment of the present disclosure provides a display substrate, which has a display area, an edge area arranged on at least one side of the display area, and a transition area arranged between the display area and the edge area, the display substrate includes: a base substrate, a plurality of sub-pixels and a redundant line located on the base substrate, the plurality of sub-pixels being arranged in an array in the display area, and the redundant line extending along a column direction of the sub-pixels and passes through the transition area; each of the sub-pixels includes a pixel driving circuit including a storage capacitor; at least part of second electrodes of storage capacitors extend from the display area to the transition area and are electrically connected with the redundant line.

In some implementations, the second electrodes of the storage capacitors in pixel driving circuits in a column of sub-pixels close to the transition area are electrically connected to the redundant line.

In some implementations, each of the second electrodes of the storage capacitors in the pixel driving circuits in the column of sub-pixels close to the transition area includes: a main portion and a protrusion portion connected with the main portion, the protrusion portion being electrically connected with the redundant line.

In some implementations, a length of an orthographic projection of the protrusion portion on the base substrate in the column direction is ½ to ⅔ of a length of an orthographic projection of the main portion on the base substrate in the column direction; a length of the orthographic projection of the protrusion portion on the base substrate along a row direction is 2 to 4 times of a length of an orthographic projection of the redundant line on the base substrate in the row direction.

In some implementations, the display substrate further includes: a first conductive layer, a second conductive layer, a third conductive layer and a fourth conductive layer sequentially arranged on the base substrate along a direction away from the base substrate, the second conductive layer includes the second electrode of the storage capacitor; and the third conductive layer includes the redundant line.

In some implementations, the display substrate further includes: a plurality of first transfer portions located in the edge area on the base substrate, a plurality of scanning signal lines extending from the edge area to the display area by passing through the transition area, a plurality of light emission control signal lines located on the base substrate and extending from the edge area to the display area by passing through the transition area, and a plurality of reset signal lines located on the base substrate and extending from the edge area to the display area by passing through the transition area, the pixel driving circuit further includes a plurality of thin film transistors, a part of the first transfer portions are electrically connected with gates of a part of the thin film transistors through the scanning signal lines; a part of the first transfer portions are electrically connected with gates of a part of the thin film transistors through the light emission control signal lines; and a part of the first transfer portions are electrically connected with gates of a part of the thin film transistors through the reset signal lines.

In some implementations, the first conductive layer includes at least one type of the scanning signal lines, the first transfer portions, the gates of the thin film transistors, the light emission control signal lines, or the reset signal lines.

In some implementations, the display substrate further includes: a plurality of first initialization signal lines and a plurality of second initialization signal lines which are located on the base substrate and extend from the edge area to the display area by passing through the transition area, a part of the first transfer portions are electrically connected with first electrodes or second electrodes of a part of the thin film transistors through the plurality of first initialization signal lines or the plurality of second initialization signal lines.

In some implementations, the second conductive layer further includes: a plurality of first initialization signal lines and a plurality of second initialization signal lines; and the third conductive layer further includes the first electrodes and the second electrodes of the thin film transistors.

In some implementations, a part of the first transfer portions are electrically connected to each other through a first transfer wire; and the third conductive layer further includes the first transfer wire.

In some implementations, the display substrate further includes: a plurality of data signal lines located in the display area on the base substrate, the data signal lines are electrically connected with the first electrodeds or the second electrodes of a part of the thin film transistors; and the third conductive layer further includes the plurality of data signal lines.

In some implementations, the display substrate further has a camera device region located in the display area, and in the camera device region, a part of the data signal lines are electrically connected to each other through a second transfer wire; and the third conductive layer further includes the second transfer wire.

In some implementations, the display substrate further includes: a plurality of second transfer portions and a plurality of bonding wires located in the edge area on the base substrate, the second transfer portions being arranged on a side, away from the display area, of the first transfer portions; the second transfer portions are electrically connected with the first transfer portions through the bonding wires.

In some implementations, the third conductive layer further includes: the plurality of second transfer portions and the plurality of the bonding wires.

In a second aspect, an embodiment of the present disclosure provides a display device, including the display substrate as described above.

DETAIL DESCRIPTION OF EMBODIMENTS

In order to make the technical solutions of the present disclosure better understood, the present disclosure is further described in detail below with reference to the accompanying drawings and the detailed implementations.

Unless defined otherwise, technical or scientific terms used herein shall have the ordinary meaning as understood by one of ordinary skill in the art to which this disclosure belongs. The term "first", "second" and the like in this disclosure is not intended to indicate any order, quantity, or importance, but rather is used to distinguish one element from another. Also, the term "a", "an", "the" or the like does not denote a limitation of quantity, but rather denotes the presence of at least one. The term "comprising/including", "comprises/includes" or the like means that the element or item preceding the word includes the element or item listed after the word and its equivalent, but does not exclude other elements or items. The term "connected/connecting", "coupled/coupling" or the like is not restricted to physical or mechanical connections, but may include electrical connections, whether direct or indirect. The terms "upper/on/above", "lower/under/below", "left", "right", or the like are used only to indicate relative positional relationships, and when the absolute position of the object being described is changed, the relative positional relationships may also be changed accordingly.

It should be noted that the transistors used in the embodiments of the present disclosure may be thin film transistors or field effect transistors or other devices with the same characteristics, and since a source and a drain of each transistor are symmetrical, the source and the drain of each transistor are not different. In the embodiments of the present disclosure, in order to distinguish the source and the drain of the transistor, one of the source or the drain of the transistor is referred to as a first electrode, the other one of the source or the drain of the transistor is referred to as a second electrode, and a gate of the transistor is referred to as a control electrode. Further, the transistors may be classified into N-type transistors and P-type transistors according to characteristics thereof. In a case where an N-type transistor is adopted, the first electrode is the source of the N-type transistor, the second electrode is the drain of the N-type transistor, when the gate of the N-type transistor is input with a high level, the source and the drain of the N-type transistor are electrically conducted, and it is opposite for the P-type transistor. It is contemplated that implementations with P-type transistors will be readily apparent to one skilled in the art without any creative effort, and thus are within the scope of the embodiments of the present disclosure.

Figure 1:
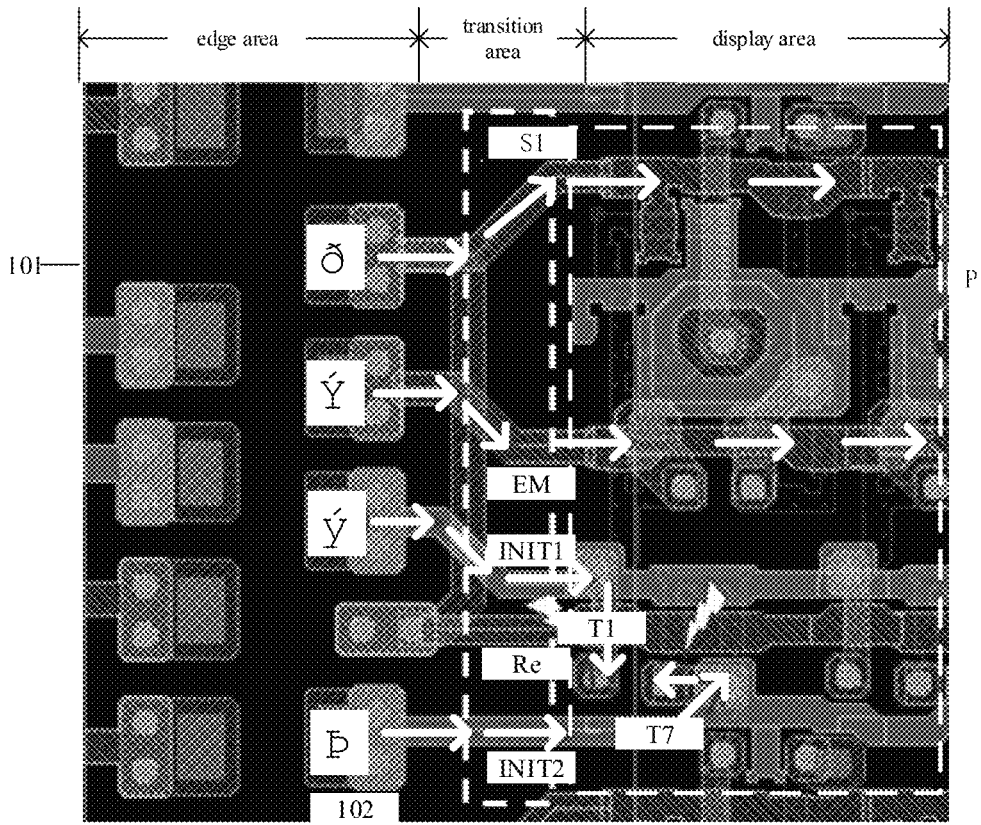
FIG. 1 is a schematic structural diagram of an exemplary display substrate.

FIG. 1 is a schematic structural diagram of an exemplary display substrate, and as shown in FIG. 1, the display substrate has a display area, an edge area disposed on at least on one side of the display area, and a transition area disposed between the display area and the edge area, the display substrate includes: a base substrate 101, and a plurality of sub-pixels P which are arranged on the base substrate 101 and arranged in an array in the display area. Each sub-pixel P includes a pixel drive circuit. The pixel driving circuit includes a plurality of thin film transistors and a storage capacitor C. The display substrate further includes: a plurality of first transfer portions 102 disposed on the base substrate 101 and in the edge area, and a plurality of signal transmission lines extending from the edge area to the display area by passing through the transition area. Specifically, the signal transmission lines may include a scanning signal line S1, a light emission control signal line EM, a first initialization signal line INIT1, and a second initialization signal line INIT2.

Figure 2:
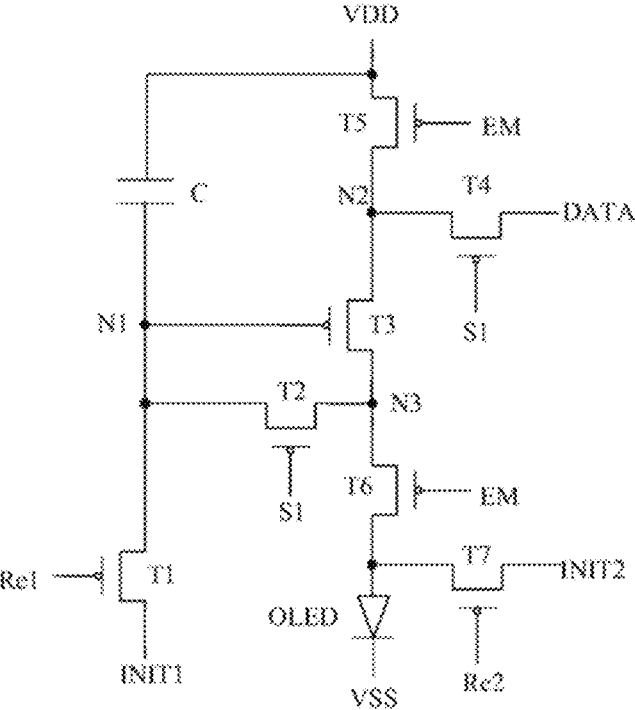
FIG. 2 is a schematic structural diagram of an exemplary pixel driving circuit.

FIG. 2 is a schematic structural diagram of an exemplary pixel driving circuit, as shown in FIG. 2, the pixel driving circuit includes: a first transistor T1, a second transistor T2, a third transistor T3, a fourth transistor T4, a fifth transistor T5, a sixth transistor T6, a seventh transistor T7, a storage capacitor C and a light-emitting device OLED. The third transistor T3 is a driving transistor configured to control brightness of the light-emitting device OLED by controlling a magnitude of a current flowing through the transistor. A node connected with a gate of the third transistor is a first node N1, a node at which the third transistor T3 and the fourth transistor T4 are connected to each other is a second node N2, and a node at which the third transistor T3 and the second transistor T2 are connected to each other is a third node N3.

A first electrode of the first transistor T1 is connected to the first initialization signal line INIT1, a control electrode of the first transistor T1 is connected to a first reset signal line Re1, and a second electrode of the first transistor T1 is connected to the first node N1; when a scanning signal at a turned-on level is applied to the first reset signal line Re1, the first transistor T1 transmits a first initialization signal to a control electrode of the third transistor T3 to initialize a voltage at the control electrode of the third transistor T3.

A control electrode of the second transistor T2 is connected to the scanning signal line S1, a first electrode of the second transistor T2 is connected to the first node N1, and a second electrode of the second transistor T2 is connected to a second electrode of the third transistor T3; when the scanning signal at the turned-on level is applied to the scanning signal line S1, the second transistor T2 electrically connects the control electrode of the third transistor T3 with the second electrode of the third transistor T3.

The control electrode of the third transistor T3 is connected to the first node N1, that is, the control electrode of the third transistor T3 is connected to a second electrode of the storage capacitor C, a first electrode of the third transistor T3 is connected to the second node N2, and the second electrode of the third transistor T3 is connected to the third node N3. The third transistor T3 determines a value of a driving current flowing between a first electrode and a second electrode of the light-emitting device OLED according to a potential difference between the control electrode and the first electrode of the third transistor, so as to drive the light-emitting device OLED to emit light.

A first electrode of the fourth transistor T4 is connected to a data signal line DATA, a second electrode of the fourth transistor T4 is connected to the second electrode of the third transistor T3, and a control electrode of the fourth transistor T4 is connected to the scanning signal line S1; when the scanning signal at the turned-on level is applied to the scanning signal line S1, the fourth transistor T4 is configured to input a data voltage supplied from the data signal line DATA into the pixel driving circuit.

A control electrode of the fifth transistor T5 is connected to a light emission signal control line EM, a first electrode of the fifth transistor T5 is connected to a first power signal line VDD, a second electrode of the fifth transistor T5 is connected to the first electrode of the third transistor T3, that is, the second electrode of the fifth transistor T5 is connected to the second node N2; a control electrode of the sixth transistor T6 is connected to the light emission signal control line EM, a first electrode of the sixth transistor T6 is connected to the second electrode of the third transistor T3, a second electrode of the sixth transistor T6 is connected to the first electrode of the light-emitting device, and the first electrode of the sixth transistor T6 is also connected to the third node N3. When a light emission signal at a turned-on level is applied to the light emission signal line EM, the fifth transistor T5 and the sixth transistor T6 are turned on, and a driving current flows through the light-emitting device OLED to cause the light-emitting device OLED to emit light.

A control electrode of the seventh transistor T7 is connected to a second reset signal line Re2, a first electrode of the seventh transistor T7 is connected to the second initialization signal line INIT2, and a second electrode of the seventh transistor T7 is connected to the first electrode of the light-emitting device. When the scanning signal at the turned-on level is applied to the second reset signal line Re2, the seventh transistor T7 transmits a second initialization signal to the first electrode of the light-emitting device to initialize the first electrode of the light-emitting device or discharge charges accumulated on the first electrode of the light-emitting device.

The storage capacitor C has the first electrode connected to the first power signal line VDD and the second electrode C' connected to the first node N1. That is, the second electrode C' of the storage capacitor C is connected to the control electrode of the third transistor T3.

In some implementations, the light-emitting device may be an organic light-emitting diode (OLED) including a first electrode (anode), an organic light-emitting layer, and a second electrode (cathode) that are stacked, or may be a quantum dot light-emitting diode (QLED) including a first electrode (anode), a quantum dot light-emitting layer, and a second electrode (cathode) that are stacked. Certainly, other types of light-emitting devices are also feasible, and are not listed here.

In some implementations, the second electrode of the light-emitting device is connected to a second power signal line VSS, a signal of the second power signal line VSS is at a low level, and a signal of the first power signal line VDD is at a high level. That is, for an $m^{th}$ display row, the second reset signal line Re2 is represented as Re(m), the first reset signal line Re1 is represented as Re(m-1), and the first reset signal line Re1 in the pixel driving circuit of a current display row and the second reset signal line Re2 in the pixel driving circuit of a previous display row may be the same for providing a same signal, so that the number of signal lines of the display panel can be reduced, and a narrow bezel of the display panel can be realized.

In some implementations, all seven transistors in the pixel driving circuit each may be a P-type transistor, or may be an N-type transistor. The same type of transistors are adopted in the pixel driving circuit, so that the process flow can be simplified, the process difficulty of the display panel is reduced, and the yield of products is improved. In some implementations, first to seventh transistors T1 to T7 may include P-type transistors and N-type transistors. It should be noted that the transistors used in the embodiments of the present disclosure may be thin film transistors or field effect transistors or other switching devices with the same characteristics, and the thin film transistors may include oxide semiconductor thin film transistors, amorphous silicon thin film transistors or polysilicon thin film transistors, and the like. The source and the drain of the transistor may be symmetrical in structure, so that there may be no difference in physical structure between the source and the drain of the transistor. In the embodiments of the present disclosure, in order to distinguish, except the gate serving as the control electrode of the transistor, one of the source or the drain of the transistor is directly described as the first electrode, and the other of the source or the drain of the transistor is directly described as the second electrode, so that the first electrode and the second electrode of each of all or part of the transistors in the embodiments of the present disclosure may be interchanged as desired.

In some implementations, the pixel driving circuit of the sub-pixel may have a structure including other numbers of transistors and capacitors, such as a 7T2C structure, a 6T1C structure, a 6T2C structure, or a 9T2C structure, besides the above-mentioned 7T1C structure (i.e., including seven transistors and one capacitor), the embodiments of the present disclosure is not limited thereto.

Generally, a plurality of conductive layers, for example, four conductive layers, are sequentially disposed in the display substrate along a direction away from the base substrate 101, the four conductive layers include a first conductive layer, a second conductive layer, a third conductive layer, and a fourth conductive layer, which may be respectively referred to as a first gate conductive layer Gate1, a second gate conductive layer Gate2, a first source-drain conductive layer SD1, and a second source-drain conductive layer SD2. In the technology combining a high-resolution display with a full-screen camera, in order to guarantee a relatively high resolution and a relatively narrow bezel, redundant sub-pixels at an edge of the display area of the display substrate are cancelled, moreover, in order to reduce a parasitic capacitance, data signal lines, power signal lines and the like in the display substrate with a relatively high resolution are formed by using the second source-drain conductive layer SD2, and the first source-drain conductive layer SD1 only plays a role of transferring the data signal line DATA around the camera device region.

During manufacturing the display substrate, after the first source-drain conductive layer SD1 is formed, a passivation layer is formed on the first source-drain conductive layer SD1, and then the second source-drain conductive layer SD2 is formed on the passivation layer. Since a density of wires in the first source-drain conductive layer SD1 is greatly reduced, effective transmission paths of charges are reduced, and static electricity is discharged frequently during manufacturing the passivation layer, so that the static electricity is discharged from the signal transmission lines to the devices in the display area through, for example, the following four paths ① to ④ shown in FIG. 1, in a first path ①, the static electricity is discharged along the scanning signal line S1, in a second path ②, the static electricity is discharged along the light emission control signal line EM, in a third path ③, the static electricity is discharged along the first initialization signal line INIT1, and in a fourth path ④, the static electricity is discharged along the second initialization signal line INIT2.

Since the first initialization signal line INIT1 is connected to the first electrode of the first transistor T1, and the second initialization signal line INIT2 is connected to the first electrode of the seventh transistor T7, that is, each of the first initialization signal line INIT1 and the second initialization signal line INIT2 is electrically connected to an active layer of the thin film transistor corresponding thereto, during discharging the static electricity, active layers of the first transistor T1 and the seventh transistor T7 in the display area are prone to be broken down by the static electricity, affecting the display effect.

In order to solve at least one of the above technical problems, embodiments of the present disclosure provide a display substrate and a display device, and the display substrate and the display device provided by the embodiments of the present disclosure will be described below in further detail with reference to the accompanying drawings and the detailed implementations.

Figures 3, 4:
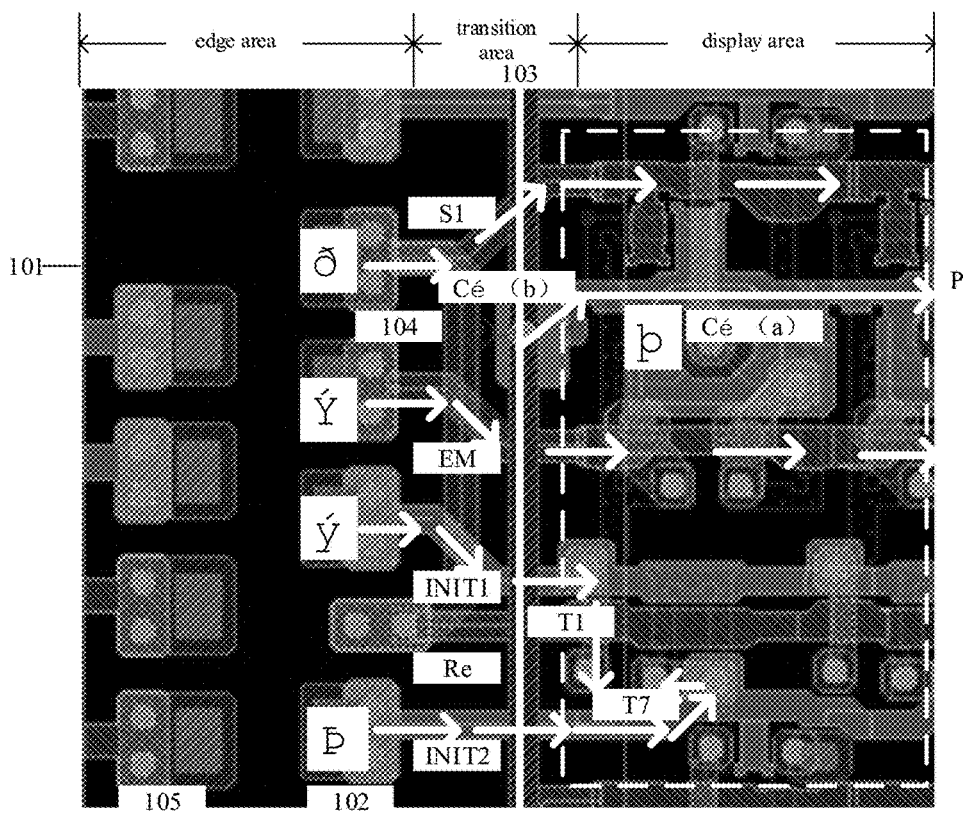
FIG. 3 is a schematic structural diagram of a display substrate according to an embodiment of the present disclosure.
FIG. 4 is a schematic structural diagram of a display substrate according to an embodiment of the present disclosure.

In a first aspect, an embodiment of the present disclosure provides a display substrate, and FIG. 3 is a schematic structural diagram of the display substrate provided in the embodiment of the present disclosure, as shown in FIG. 3, the display substrate has a display area, an edge area disposed on at least one side of the display area, and a transition area disposed between the display area and the edge area. The display substrate includes a base substrate 101, a plurality of sub-pixels P and a redundant line 103 located on the base substrate 101, the plurality of sub-pixels P being arranged in an array in the display area, and the redundant line 103 extending along a column direction of the sub-pixels P (i.e., a direction along which each column of sub-pixels P are arranged) and passing through the transition area. Each sub-pixel includes a pixel drive circuit, the pixel driving circuit including a storage capacitor C. The second electrode C' of each of at least part of storage capacitors C extends from the display area to the transition area and is electrically connected with the redundant line 103.

The base substrate 101 may be made of a rigid material such as glass, which can improve the capacity of the base substrate 101 for supporting film layers thereon. Certainly, the base substrate 101 may also be made of a flexible material such as polyimide (PI), which can improve the overall bending and tensile resistance of the display substrate, and avoid the base substrate 101 from being broken due to the stress generated during being bended, stretched, and twisted and thus resulting in a broken circuit. In practical applications, the material of the base substrate 101 can be selected reasonably as desired to ensure that the display substrate has good performance.

The display substrate may include the plurality of sub-pixels P arranged in an array in the display area, and adjacent sub-pixels P may emit light of different colors. For example, three adjacent sub-pixels may emit red light, green light, and blue light, respectively. Each of the sub-pixels P may include a pixel driving circuit and a light-emitting device, the structure of the pixel driving circuit may be the same as that shown in FIG. 3. The pixel driving circuit in each sub-pixel is connected to the scanning signal line S1, the data signal line DATA, the light emission control signal line EM, the first initialization signal line INIT1, the second initialization signal line INIT2, and the like, and receives a data voltage transmitted from the data signal line DATA and outputs a corresponding current to the light-emitting device under the control of signals of the scanning signal line S1 and the light emission control signal line EM. In each sub-pixel, the light-emitting device is connected to the pixel driving circuit, and the light-emitting device may emit light with corresponding brightness under the driving of a current output by the pixel driving circuit.

The redundant line 103 and the second electrode C' of the storage capacitor C each may be made of a metal material with a good electrical conductivity, for example, may be made of at least one of copper, aluminum, molybdenum, or nickel. The redundant line 103 and the second electrode C' of the storage capacitor C each may have a single-layer structure made of one of the above materials, or may have a multi-layer structure made of multiple ones of the above materials.

In the display substrate provided by the embodiment of the present disclosure, the redundant line 103 may extend along the column direction of the sub-pixels P and pass through the transition area, and the second electrode C' of the storage capacitor C may extend from the display area to the transition area and be electrically connected to the redundant line 103. It can be seen that an extending direction in which the redundant line 103 extends intersects with an extending direction in which the second electrode C' of the storage capacitor C extends, and the redundant line 103 and the second electrode C' of the storage capacitor C may be electrically connected to form a mesh structure. An area of a cross-section of the formed mesh structure is much larger than an area of a cross-section of the signal transmission line in the display substrate, so that an impedance of the formed mesh structure is much smaller than an impedance of the signal transmission line. During discharging the static electricity, the formed mesh structure may be a desired path for discharging charges (i.e., the path ⑤ shown in the figure), and the charges can be prevented from being transmitted to devices in the display area by other signal transmission lines, so as to prevent the static electricity from breaking down the active layer of the thin film transistor in the pixel driving circuit, thereby improving the display effect. Moreover, the formed mesh structure provides a new path for discharging the static electricity, so that the charges can be effectively discharged, avoiding the accumulation of a large amount of charges in the display substrate, and improving the display effect.

In some implementations, as shown in FIG. 3, the second electrodes C' of the storage capacitors C in the driving circuits of the column of sub-pixels P close to the transition area are electrically connected to the redundant line 103.

Specifically, the second electrodes C' of the storage capacitors C in the driving circuits of the column of sub-pixels P close to the transition area may be electrically connected to the redundant line 103, and the second electrodes C' of the storage capacitors C in the driving circuits of the column of sub-pixels P and the redundant line 103 may form a mesh structure, an area of a cross-section of the formed mesh structure is much larger than an area of a cross-section of the signal transmission line in the display substrate, so that an impedance of the formed mesh structure is much smaller than an impedance of the signal transmission line. During discharging the static electricity, the formed mesh structure may be a desired path for discharging charges, and the charges can be prevented from being transmitted to devices in the display area by other signal transmission lines, so as to prevent the static electricity from breaking down the active layer of the thin film transistor in the pixel driving circuit, thereby improving the display effect. Moreover, a distance between the column of sub-pixels P close to the transition area and the redundant line 103 is relatively small, which is convenient for wiring between the redundant line 103 and the second electrodes C' of the storage capacitors C in the driving circuits of the column of sub-pixels P close to the transition area, thereby reducing the process difficulty and the manufacturing cost. Certainly, the second electrodes C' of the storage capacitors C in the driving circuits of another column of sub-pixels P may alternatively be electrically connected to the redundant line 103, which is not illustrated herein.

In some implementations, as shown in FIG. 3, the second electrodes C' of the storage capacitors C in the driving circuits of the column of sub-pixels P close to the transition area each include: a main portion a and a protrusion portion b connected with the main portion a, the protrusion portion b being electrically connected to the redundant line 103.

The main portion a of the second electrode C' of the storage capacitor C may overlap the first electrode of the storage capacitor C to store charges. The protrusion portion b extends toward the transition area to be electrically connected with the redundant line 103.

In some implementations, as shown in FIG. 3, a length of an orthographic projection of the protrusion portion b on the base substrate 101 in the column direction is ½ to ⅓ of a length of an orthographic projection of the main portion a on the base substrate 101 in the column direction; a length of the orthographic projection of the protrusion portion b on the base substrate 101 in a row direction is 2 to 4 times a length of the orthographic projection of the redundant line 103 on the base substrate 101 in the row direction.

A length of the protrusion portion b in the column direction may be slightly smaller than a length of the main portion a in the column direction, and therefore a phenomenon that the protrusion portion b and other signal lines are overlapped with each other to cause a short circuit to influence the performance of the display substrate is avoided. Moreover, a length of the protrusion portion b in the row direction is greater than a length of the redundant line 103 in the row direction, so that the protrusion portion b and the redundant line 103 may be overlapped, and an influence, on the transmission path of charges, caused by a poor contact between the protrusion portion b and the redundant line 103 is avoided.

In some implementations, the display substrate further includes: a first conductive layer, a second conductive layer, a third conductive layer and a fourth conductive layer which are sequentially arranged on the base substrate 101 along a direction away from the base substrate 101. The second conductive layer includes the second electrodes C' of the storage capacitors C, and the third conductive layer includes the redundant line 103.

The first conductive layer, the second conductive layer, the third conductive layer and the fourth conductive layer may be referred to as a first gate conductive layer Gate1, a second gate conductive layer Gate2, a first source-drain conductive layer SD1, and a second source-drain conductive layer SD2, respectively. The second electrode C' of the storage capacitor C may be formed by the second gate conductive layer Gate2, and the redundant routing 103 may be formed by the first source-drain conductive layer SD1. An insulating layer is arranged between the redundant line 103 and the second electrode C' of the storage capacitor C, and the redundant line 103 and the second electrode C' of the storage capacitor C are electrically connected through a via hole penetrating through the insulating layer. Since the signal transmission lines in the display substrate are not formed by the first source-drain conductive layer SD1, the arrangement of the redundant line 103 does not affect the wiring of other signal transmission lines, and also does not affect a design of a narrow bezel and a high resolution of the display substrate.

In some implementations, the display substrate further includes: a plurality of first transfer portions 102 disposed in the edge area on the base substrate 101, a plurality of scanning signal lines S1 extending from the edge area to the display area by passing through the transition area, a plurality of light emission control signal lines EM disposed on the base substrate 101 and extending from the edge area to the display area by passing through the transition area, and a plurality of reset signal lines Re disposed on the base substrate 101 and extending from the edge area to the display area by passing through the transition area. The pixel driving circuit further includes a plurality of thin film transistors, a part of the first transfer portions 102 being electrically connected to gates of a part of the thin film transistors through the scanning signal lines S1; a part of the first transfer portions 102 being electrically connected to gates of a part of the thin film transistors through the light emission control signal lines EM; a part of the first transfer portions 102 being electrically connected to gates of a part of the thin film transistors through the reset signal lines Re.

Each of a part of the first transfer portions 102 may transfer a scanning signal supplied from a gate driving circuit, may be electrically connected to the scanning signal line S1, and each of the part of the first transfer portions 102 may transmit the scanning signal to the gate of the second transistor T2 in the display area through the scanning signal line S1. The area of the cross-section of the mesh structure formed by the redundant line 103 and the second electrode C' of the storage capacitor C is much larger than an area of a cross-section of the scanning signal line S1 in the display substrate, so that the impedance of the formed mesh structure is much smaller than an impedance of the scanning signal line S1. During discharging the static electricity, the formed mesh structure may be a desired path for discharging charges, and the charges can be prevented from being transmitted to devices in the display area by the scanning signal line S1, so as to prevent the static electricity from affecting the second thin film transistor T2 in the pixel driving circuit, thereby improving the display effect.

Each of a part of the first transfer portions 102 may transmit a light emission control signal supplied from the gate driving circuit, and may be electrically connected to the light emission control signal line EM to transmit the light emission control signal to the gate of the fifth transistor T5 and the gate of the sixth transistor T6 in the display area through the light emission control signal line EM. The area of the cross-section of the mesh structure formed by the redundant line 103 and the second electrode C' of the storage capacitor C is much greater than an area of a cross-section of the light emission control signal line EM in the display substrate, so that an impedance of the formed mesh structure is much smaller than an impedance of the light emission control signal line EM. During discharging the static electricity, the formed mesh structure may be a desired path for discharging charges, and the charges can be prevented from being transmitted to devices in the display area by the light emission control signal line EM, so as to prevent the static electricity from affecting the fifth transistor T5 and the sixth transistor T6 in the pixel driving circuit, thereby improving the display effect.

The reset signal line Re may specifically includes a first reset signal line Re1 and a second reset signal line Re2, which are connected to the gate of the first transistor T1 and the gate of the seventh transistor T7, respectively. Each of a part of the first transfer portions 102 may transfer a reset signal supplied from the gate driving circuit, and may be electrically connected to the reset signal line Re to transmit the reset signal to the gate of the first transistor T1 and the gate of the seventh transistor T7 in the display area through the reset signal line Re. The area of the cross-section of the mesh structure formed by the redundant line 103 and the second electrode C' of the storage capacitor C is much greater than an area of a cross-section of the reset signal line Re in the display substrate, so that an impedance of the formed mesh structure is much smaller than an impedance of the reset signal line Re. During discharging the static electricity, the formed mesh structure may be a desired path for discharging charges, and the charges can be prevented from being transmitted from the reset signal line Re to the devices in the display area, so as to prevent the static electricity from affecting the first transistor T1 and the seventh transistor T7 in the pixel driving circuit, thereby improving the display effect.

In some implementations, the first conductive layer includes: at least one of the scanning signal lines S1, the first transfer portions 102, gates of the thin film transistors, the light emission control signal lines EM, or the reset signal lines Re.

The scanning signal lines S1, the first transfer portions 102, and the gates of the thin film transistors all may be formed by using the first conductive layer, i.e., the first gate conductive layer Gate1. The scanning signal lines S1, the first transfer portions 102 and the gates of the thin film transistors may be made of a same material by a single process, which can reduce the number of process steps and the manufacturing cost.

The light emission control signal lines EM may be formed by using the first conductive layer, i.e., the first gate conductive layer Gate1. The light emission control signal lines EM, the scanning signal lines S1, the first transfer portions 102 and the gates of the thin film transistors may be made of a same material by a single process, so that the number of process steps can be reduced, and the manufacturing cost can be saved.

The reset signal lines Re may be formed by using the first conductive layer, i.e., the first gate conductive layer Gate1. The reset signal lines Re, the light emission control signal lines EM, the scanning signal lines S1, the first transfer portions 102 and the gates of the thin film transistors may be made of a same material by a single process, so that the number of process steps can be reduced, and the manufacturing cost can be saved.

In some implementations, the display substrate further includes: a plurality of first initialization signal lines INIT1 and a plurality of second initialization signal lines INIT2 located on the base substrate 101 and extending from the edge area to the display area by passing through the transition area; a part of the first transfer portions 102 are electrically connected to first electrodes or second electrodes of a part of the thin film transistors through the first initialization signal lines INIT1 or the second initialization signal lines INIT2.

The first initialization signal line INIT1 and the second initialization signal line INIT2 are connected to the source (or drain) of the first transistor T1 and the source (or drain) of the seventh transistor T7, respectively. A part of the first transfer portions 102 may transmit an initialization signal supplied from the gate driving circuit, may be electrically connected to the first initialization signal line INIT1 and the second initialization signal line INIT2 to transmit the initialization signal to the source (or drain) of the first transistor T1 and the source (or drain) of the seventh transistor T7 in the display area through the first initialization signal line INIT1 and the second initialization signal line INIT2. The area of the cross-section of the mesh structure formed by the redundant line 103 and the second electrode C' of the storage capacitor C is much greater than an area of a cross-section of each of the first initialization signal line INIT1 and the second initialization signal line INIT2 in the display substrate, so that an impedance of the formed mesh structure is much smaller than an impedance of each of the first initialization signal line INIT1 and the second initialization signal line INIT2. During discharging the static electricity, the formed mesh structure may be a desired path for discharging electrostatic charges, and the charges may be prevented from being transferred from the first and second initialization signal lines INIT1 and INIT2 to devices in the display area, so as to prevent the active layers of the first transistor T1 and the second transistor T7 from being broken down by the static electricity, and thus, the display effect can be improved.

In some implementations, the second conductive layer further includes: a plurality of first initialization signal lines INIT1 and a plurality of second initialization signal lines INIT2, and the third conductive layer further includes: the first electrodes and the second electrodes of the thin film transistors.

The plurality of first initialization signal lines INIT1 and the plurality of second initialization signal lines INIT2 may be formed by using the second conductive layer, i.e., the second gate conductive layer Gate2. The plurality of first initialization signal lines INIT1, the plurality of second initialization signal lines INIT2 and the second electrodes C' of the storage capacitors C may be made of a same material by a single process, so that the number of process steps can be reduced, and the manufacturing cost can be saved. The first electrode and the second electrode of each thin film transistor may be formed by using the third conductive layer, i.e., the first source-drain conductive layer SD1, and the first electrode and the second electrode of each thin film transistor and the redundant line 103 may be made of a same material by a single process, so that the number of process steps can be reduced, and the manufacturing cost can be saved.

In some implementations, a part of the first transfer portions 102 is electrically connected to each other through a first transfer wire 104, and the third conductive layer further includes the first transfer wire 104.

Timings of signals, for example, the light emission control signals, transmitted by a part of the first transfer portions 102 are the same, for example, the timings of the light emission control signals input into the fifth transistor T5 and the sixth transistor T6 are the same, thus the part of the first transfer portions 102 that transmit the signals with the same timings may be electrically connected together through the first transfer wire 104. The first transfer wire 104 may be formed by using the third conductive layer, i.e., the first source-drain conductive layer SD1, and the first transfer wire 104 and the source and the drain of each thin film transistor may be made of a same material by a single process, so that the number of process steps can be reduced, and the manufacturing cost can be saved.

In some implementations, the display substrate further includes: a plurality of data signal lines DATA (not shown in FIG. 4) in the display area on the base substrate 101; the data signal lines DATA are electrically connected with the first electrodes or the second electrodes of a part of the thin film transistors; the third conductive layer further includes the plurality of data signal lines DATA.

The data signal line DATA may be electrically connected to the first electrode or the second electrode of the fourth transistor T4 and a data signal may be input into the second node N2, i.e., the source of the third transistor T3 from the data signal line through the fourth transistor T4 to control a degree that the third transistor T3 is turned on, so as to control a magnitude of a current in the light-emitting device, thereby controlling the brightness of the light-emitting device. The data signal lines DATA may be formed by using the third conductive layer, i.e., the first source-drain conductive layer SD1, and the data signal lines and the source and drain of each thin film transistor may be made of a same material by a single process, thereby reducing the number of process steps and saving the manufacturing cost.

In some implementations, the display substrate further has a camera device region (not shown in the drawings) disposed in the display area; in the camera device region, a part of the data signal lines DATA are electrically connected through a second transfer wire (not shown in the drawings); the third conductive layer further includes the second transfer wire.

In the camera device region, in order to achieve the display effect of a full-screen camera, a part of the data signal lines DATA are electrically connected through the second transfer wire. The second transfer wire may be formed by using the third conductive layer, i.e., the first source-drain conductive layer SD1, and the second transfer wire and the source and the drain of each thin film transistor may be made of a same material by a single process, so that the number of process steps can be reduced, and the manufacturing cost can be saved.

FIG. 4 is a schematic structural diagram of the display substrate provided in the embodiment of the present disclosure, and as shown in FIG. 4, the display substrate further includes: a plurality of second transfer portions 105 and bonding wires 106 located in the edge area on the base substrate 101; the second transfer portions 105 are disposed on a side of the first transfer portions 102 away from the display area; the second transfer portions 105 are electrically connected to the first transfer portions 102 through the bonding wires 106.

The second transfer portions 105 may be transfer portions in the gate driving circuit, and the second transfer portions 105 and the first transfer portions 102 may be electrically connected through the bonding wires 106, so that signals supplied from the gate driving circuit are transmitted to signal lines in the display area through the second transfer portions 105, the bonding wires 106, and the first transfer portions 102. Moreover, the second bonding wires 106 can provide a path (i.e., the path ⑥ shown in the figure) for discharging static electricity, so that the charges are discharged to the edge area, and the charges can be prevented from being transmitted to devices in the display area by other signal transmission lines, thereby preventing the static electricity from breaking down the active layer of the thin film transistor in the pixel driving circuit, and further improving the display effect. Morever, the second bonding wires 106 provide a new path for discharging the static electricity, so that the static electricity can be effectively discharged, and a large amount of charges are prevented from being accumulated in the display substrate, thereby improving the display effect.

In some implementations, the third conductive layer further includes: the plurality of second transfer portions 105 and the bonding wires 106.

The second transfer portions 105 and the bonding wires 106 may be formed by using the third conductive layer, i.e., the first source-drain conductive layer SD1, but not to be formed by using the original fourth conductive layer, i.e., the second source-drain electrode layer SD2, so that charges can be prevented from being transmitted to devices in the display area by other signal transmission lines, thereby preventing the static electricity from breaking down the active layer of the thin film transistor in the pixel driving circuit, and further improving the display effect.

In some implementations, the display substrate further includes a gate driving circuit (not shown) disposed in the edge area on the base substrate; the gate driving circuit is arranged on a side of the second transfer portions 105 away from the display area; the gate driving circuit includes: a plurality of thin film transistors. A width-to-length ratio of a channel region of the active layer of the thin film transistor in the gate driving circuit is greater than a width-to-length ratio of a channel region of the active layer of the thin film transistor in the pixel driving circuit.

The width-length ratio of the channel region of the active layer of the thin film transistor in the gate driving circuit is greater than a width-to-length ratio of a channel region of the active layer of the thin film transistor in the pixel driving circuit, so that the thin film transistor in the gate driving circuit has a relatively high bearing capacity for discharging the static electricity, even if the charges are conducted to the thin film transistor in the gate driving circuit, a relatively small influence on the thin film transistor is to be caused, the static electricity can be prevented from breaking down the active layer of the thin film transistor in the pixel driving circuit, and the display effect can be further improved.

In a second aspect, an embodiment of the present disclosure provides a display device, the display device includes the display substrate provided in the above embodiment, and the display device may be any product or component having a display function, such as a mobile phone, a tablet computer, a television, a computer monitor, a notebook computer, a digital photo frame, and a navigator. The implementation principle and beneficial effects of the display device are the same as those of the display substrate mentioned above, and will not be further elaborated herein.

It will be understood that the above embodiments are merely exemplary embodiments employed to illustrate the principles of the present disclosure, and the present disclosure is not limited thereto. It will be apparent to those skilled in the art that various changes and modifications may be made without departing from the spirit and scope of the present disclosure, and these changes and modifications are to be considered within the scope of the present disclosure.

What is claimed is:

1. A display substrate, having a display area, an edge area arranged on at least one side of the display area, and a transition area arranged between the display area and the edge area, the display substrate comprising: a base substrate, a plurality of sub-pixels and a redundant line located on the base substrate, the plurality of sub-pixels being arranged in an array in the display area, and the redundant line extending along a column direction of the sub-pixels and passing through the transition area, wherein each of the sub-pixels comprise a pixel driving circuit comprising a storage capacitor, at least a part of second electrodes of storage capacitors extend from the display area to the transition area and are electrically connected with the redundant line.

2. The display substrate of claim 1, wherein the second electrodes of the storage capacitors in pixel driving circuits in a column of sub-pixels close to the transition area are electrically connected to the redundant line.

3. The display substrate of claim 2, wherein each of the second electrodes of the storage capacitors in the pixel driving circuits in the column of sub-pixels close to the transition area comprises: a main portion and a protrusion portion connected with the main portion, the protrusion portion being electrically connected with the redundant line.

4. The display substrate of claim 3, wherein a length of an orthographic projection of the protrusion portion on the base substrate in the column direction is ½ to ⅔ of a length of an orthographic projection of the main portion on the base substrate in the column direction;

a length of the orthographic projection of the protrusion portion on the base substrate along a row direction is 2 to 4 times of a length of an orthographic projection of the redundant line on the base substrate in the row direction.

5. The display substrate of claim 1, further comprising: a first conductive layer, a second conductive layer, a third conductive layer and a fourth conductive layer sequentially arranged on the base substrate along a direction away from the base substrate, wherein the second conductive layer comprises the second electrode of the storage capacitor; and the third conductive layer comprises the redundant line.

6. The display substrate of claim 5, further comprising: a plurality of first transfer portions located in the edge area on the base substrate, a plurality of scanning signal lines extending from the edge area to the display area by passing through the transition area, a plurality of light emission control signal lines located on the base substrate and extending from the edge area to the display area by passing through the transition area, and a plurality of reset signal lines located on the base substrate and extending from the edge area to the display area by passing through the transition area, wherein the pixel driving circuit further comprises a plurality of thin film transistors, a part of the first transfer portions are electrically connected with gates of a part of the thin film transistors through the scanning signal lines;

a part of the first transfer portions are electrically connected with gates of a part of the thin film transistors through the light emission control signal lines; and a part of the first transfer portions are electrically connected with gates of a part of the thin film transistors through the reset signal lines.

7. The display substrate of claim 6, wherein the first conductive layer comprises at least one type of the scanning signal lines, the first transfer portions, the gates of the thin film transistors, the light emission control signal lines, or the reset signal lines.

8. The display substrate of claim 6, further comprising: a plurality of first initialization signal lines and a plurality of second initialization signal lines which are located on the base substrate and extend from the edge area to the display area by passing through the transition area, wherein a part of the first transfer portions are electrically connected with first electrodes or second electrodes of a part of the thin film transistors through the first initialization signal lines or the second initialization signal lines.

9. The display substrate of claim 8, wherein the second conductive layer further comprises: a plurality of first initialization signal lines and a plurality of second initialization signal lines; and the third conductive layer further comprises the first electrodes and the second electrodes of the thin film transistors.

10. The display substrate of claim 6, wherein a part of the first transfer portions are electrically connected to each other through a first transfer wire; and the third conductive layer further comprises the first transfer wire.

11. The display substrate of claim 6, further comprising: a plurality of data signal lines located in the display area on the base substrate, wherein the data signal lines are electrically connected with the first electrodes or the second electrodes of a part of the thin film transistors; and the third conductive layer further comprises the plurality of data signal lines.

12. The display substrate of claim 11, further having a camera device region located in the display area, wherein in the camera device region, a part of the data signal lines are electrically connected to each other through a second transfer wire; and the third conductive layer further comprises the second transfer wire.

13. The display substrate of claim 6, further comprising: a plurality of second transfer portions and a plurality of bonding wires located in the edge area on the base substrate, the second transfer portions being arranged on a side, away from the display area, of the first transfer portions, wherein the second transfer portions are electrically connected with the first transfer portions through the bonding wires.

14. The display substrate of claim 13, wherein the third conductive layer further comprises: the plurality of second transfer portions and the plurality of the bonding wires.

15. A display device, comprising: the display substrate of claim 1.

16. The display device of claim 15, wherein the second electrodes of the storage capacitors in pixel driving circuits in a column of sub-pixels close to the transition area are electrically connected to the redundant line.

17. The display device of claim 16, wherein each of the second electrodes of the storage capacitors in the pixel driving circuits in the column of sub-pixels close to the transition area comprises: a main portion and a protrusion portion connected with the main portion, the protrusion portion being electrically connected with the redundant line.

18. The display device of claim 17, wherein a length of an orthographic projection of the protrusion portion on the base substrate in the column direction is ½ to ⅔ of a length of an orthographic projection of the main portion on the base substrate in the column direction;

a length of the orthographic projection of the protrusion portion on the base substrate along a row direction is 2 to 4 times of a length of an orthographic projection of the redundant line on the base substrate in the row direction.

19. The display device of claim 15, the display substrate further comprises: a first conductive layer, a second conductive layer, a third conductive layer and a fourth conductive layer sequentially arranged on the base substrate along a direction away from the base substrate, wherein the second conductive layer comprises the second electrode of the storage capacitor; and the third conductive layer comprises the redundant line.

20. The display device of claim 15, the display substrate further comprises: a first conductive layer, a second conductive layer, a third conductive layer and a fourth conductive layer sequentially arranged on the base substrate along a direction away from the base substrate, wherein the second conductive layer comprises the second electrode of the storage capacitor; and the third conductive layer comprises the redundant line.

* * * * *